United States Patent [19]
Nakanishi et al.

[11] Patent Number: 5,793,108
[45] Date of Patent: Aug. 11, 1998

[54] SEMICONDUCTOR INTEGRATED CIRCUIT HAVING A PLURALITY OF SEMICONDUCTOR CHIPS

[75] Inventors: Hiroyuki Nakanishi; Toshiya Ishio, both of Tenri, Japan

[73] Assignee: Sharp Kabushiki Kaisha, Osaka, Japan

[21] Appl. No.: 637,347

[22] Filed: Apr. 25, 1996

[30] Foreign Application Priority Data

May 30, 1995 [JP] Japan ................................ 7-131644

[51] Int. Cl.[6] .................................................. H01L 23/34
[52] U.S. Cl. ........................... 257/723; 257/777; 257/724
[58] Field of Search .................................. 257/777, 723, 257/724, 677

[56] References Cited

U.S. PATENT DOCUMENTS 4,251,852  2/1981  Ecker et al. ............................ 257/712

FOREIGN PATENT DOCUMENTS 62-147360   9/1987  Japan .
3-165550    7/1991  Japan ........................................ 257/777
4-155954    5/1992  Japan .
4-184949    7/1992  Japan .
4-302164   10/1992  Japan .
5-3284      1/1993  Japan ........................................ 257/724
5-121462    5/1993  Japan .
6-177322    6/1994  Japan ........................................ 257/777

Primary Examiner—Jerome Jackson
Assistant Examiner—Nathan K. Kelley
Attorney, Agent, or Firm—Nixon & Vanderhye PC

[57] ABSTRACT

A central portion of a front surface of a first semiconductor chip is bonded to a first surface of a die pad of a lead frame via an elastic insulating film. A peripheral portion having electrodes of the front surface is outside of the die pad. With a back surface of the first semiconductor chip put in contact with a jig surface, wire bonding of the first semiconductor chip is performed. Then, with a second surface of the die pad opposite from the first semiconductor chip put in contact with a jig surface, a back surface of a second semiconductor chip is bonded to the back surface of the semiconductor chip via an adhesive. With the second surface of the die pad put in contact with a jig surface, wire bonding of the second semiconductor chip is performed.

16 Claims, 8 Drawing Sheets

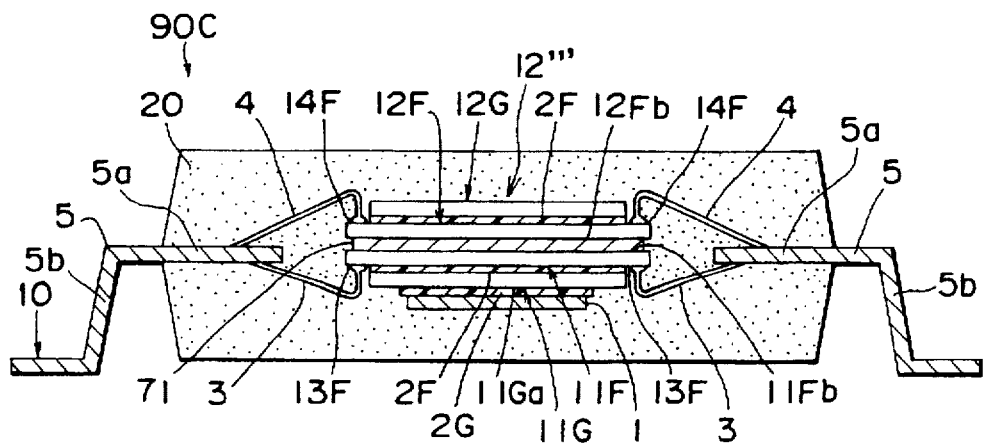
Fig 11A
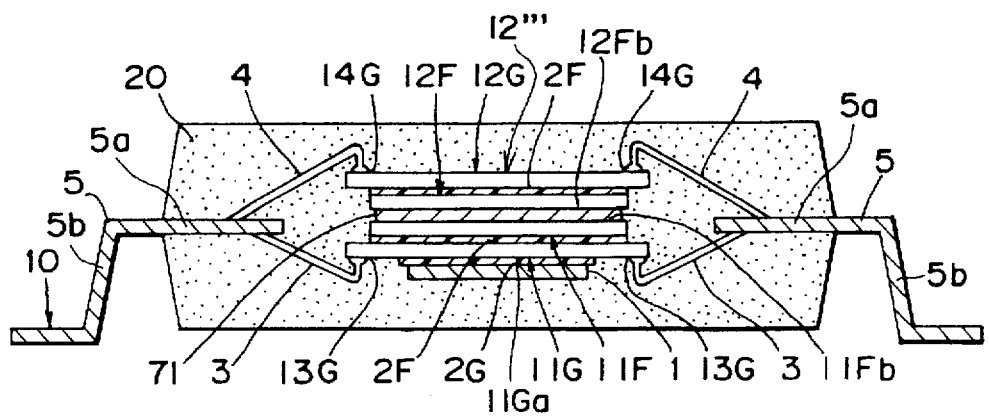
Fig 11B
Fig 12 PRIOR ART
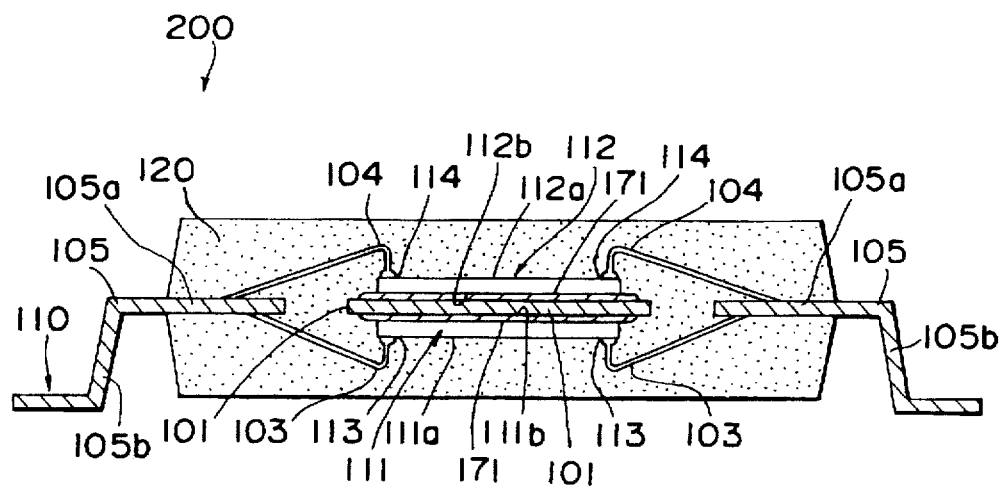

SEMICONDUCTOR INTEGRATED CIRCUIT HAVING A PLURALITY OF SEMICONDUCTOR CHIPS

BACKGROUND OF THE INVENTION

The present invention relates to a semiconductor integrated circuit in which two or more semiconductor chips are assembled into one package, and a method of manufacturing such a semiconductor integrated circuit.

In accordance with the recent trend of functional improvement and reduction in size and weight of electronic equipment, semiconductor integrated circuits in which two or more semiconductor chips are assembled into one package have been industriously researched and developed.

As such a semiconductor integrated circuit, there is known a device 200 shown in FIG. 12, in which semiconductor chips 111 and 112 are bonded to opposite surfaces of a die pad 101 of a lead frame 110 via a silver paste layer 171 (Japanese Utility Model Laid-Open Publication No. SHO 62-147360). Electrodes 113 and 114 provided on surfaces 111a and 112a of the respective semiconductor chips 111 and 112 are connected to inner portions (inner leads) 105a of leads 105 of the lead frame 110 by metal wires 103 and 104. Reference numeral 120 denotes an encapsulating resin.

The semiconductor integrated circuit 200 is manufactured by the following methods.

FIGS. 13A–13I show a first manufacturing method. First, as shown in FIG. 13A, a planar lead frame 110 having a die pad 101 and leads 105 is prepared. Then, as shown in FIG. 13B, the lead frame 110 is placed on a flat jig 170, and a silver paste 171 is applied onto one surface of the die pad 101 by means of a dispenser 172. Subsequently, as shown in FIG. 13C, a first semiconductor chip 111 is mounted on the silver paste 171 with the leads 105 clamped by a jig 152, and a front surface 111a of the semiconductor chip 111 is pressed from above by a collet 151 with the die pad 101 supported by a jig 150. The above arrangement is to expand the silver paste 171 over the surface of the die pad 101 so as to improve adhesion and parallelism between the die pad 101 and the semiconductor chip 111. Then, by heating, the silver paste 171 is hardened. At this stage, die bonding of the semiconductor chip 111 is completed. Then, as shown in FIG. 13D, the lead frame 110 is inverted, and silver paste 171 is applied by a dispenser 172 onto a surface of the die pad 101 opposite from the semiconductor chip 111 with the leads 105 supported by a jig 175. Subsequently, as shown in FIG. 13E, a second semiconductor chip 112 is placed on the silver paste 171, and a front surface 112a of the semiconductor chip 112 is pressed by the collet 151 with the leads 105 clamped by the jig 152 and with the front surface 111a of the semiconductor chip 111 supported by a jig 155. By heating, the silver paste 171 is hardened. Die bonding of the semiconductor chip 112 is now completed.

Then, as shown in FIG. 13F, the lead frame 110 is inverted again, and with the semiconductor chip 112 and the leads 105 securely held between a jig 160 and a jig 162 for preventing vibration, electrodes 113 provided on the front surface of the semiconductor chip 111 (generally, electrodes are provided along outer edges of the semiconductor chip surface) are connected with the inner leads 105a by a gold wire 103 using a bonding tool 161. Thus, wire bonding of the semiconductor chip 111 is completed. Further, as shown in FIG. 13G, the lead frame 110 is inverted again, and with the semiconductor chip 111 and the leads 105 securely held between a jig 165 and the jig 162, the electrodes 114 provided on the front surface of the semiconductor chip 112 are connected with the inner leads 105a by a gold wire 104 using the bonding tool 161. Thus, wire bonding of the semiconductor chip 112 is completed.

Then, as shown in FIG. 13H, elements except for outer portions (outer leads) 105b of the leads 105 are encapsulated i.e., sealed by the resin 120. Finally, as shown in FIG. 13I, dam bars (not shown) connecting the adjacent leads 105 are punched out such that the adjacent leads 105 are disconnected from each other, and the outer leads 105b are bent in a specified shape. In this way, device manufacturing is completed.

A second manufacturing method is the same as the first method, except that the wire bonding process (FIG. 13F) of the first semiconductor chip 111 and the wire bonding process (FIG. 13G) of the second semiconductor chip 112 are performed in reverse order.

A third manufacturing method is shown in FIGS. 14A through 14I. In the third method, the die bonding process (FIGS. 14B and 14C) and the wire bonding process (FIG. 14D) of the first semiconductor chip 111 are performed first, and subsequently the die bonding process (FIGS. 14E and 14F) and the wire bonding process (FIG. 14G) of the second semiconductor chip 112 are performed. It is to be noted that the processes of FIGS. 14A, 14H and 14I are the same as the processes of FIGS. 13A, 13H and 13I.

According to the first and second manufacturing methods, in the die bonding process (FIG. 13E) of the second semiconductor chip 112, the first semiconductor chip 111 is pressed from above by the collet 151 with its front surface 111a being in contact with the surface of the jig 155. Therefore, foreign objects such as silicon chip fragments staying on the surface of the jig 155 damage a surface passivation film of the semiconductor chip 111, and this results in damage of the front surface 11a of the semiconductor chip 111. Furthermore, the front surface 112a of the second semiconductor chip 112 and the front surface 111a of the first semiconductor chip 111 are put in contact respectively with the surfaces of the jigs 160 and 165 in the wire bonding process (FIG. 13F) of the first semiconductor chip 111 and the wire bonding process (FIG. 13G) of the second semiconductor chip 112. Therefore the same problem occurs. Similarly, according to the third manufacturing method, in the die bonding process (FIG. 14F) and the wire bonding process (FIG. 14G) of the second semiconductor chip 112, the front surface 11a of the first semiconductor chip 111 is put in contact with the surfaces of the jigs 155 and 165, thus suffering a damage. When suffering such a damage, the semiconductor chips 111 and 112 are destroyed and eventually become electrically inoperable. Even though they operate normally immediately after the assembly, moisture entering through the damaged portion oxidizes the metal wires to break the same, and this results in a deteriorated reliability.

In order to avoid the above problem, there has been proposed a semiconductor device manufacturing method in which after performing die bonding of the first semiconductor chip onto one surface of the lead frame, wire bonding of the semiconductor chip to the inner leads is performed and then only the first semiconductor chip side of the lead frame is encapsulated in resin (Japanese Patent Laid-Open Publication No. HEI 5-121462). According to this method, die bonding of the second semiconductor chip to the surface of the lead frame on the side opposite from the first semiconductor chip and wire bonding of the semiconductor chip to the inner leads are subsequently performed, and then the second semiconductor chip side of the lead frame is encapsulated in resin. According to this method, the front surface of the first semiconductor chip is protected by resin during the die bonding process and the wire bonding process of the second semiconductor chip. Therefore the aforementioned problem can be resolved. However, since the resin encapsulating or sealing process is performed in two stages, two types of metal molds are required, and this results in an increased equipment cost. Furthermore, because an additional resin encapsulating process is required, the cost per device increases.

There has been proposed a further method of connecting first and second semiconductor chips to opposing surfaces of a TAB (Tape Automated Bonding) tape via bump electrodes, and connecting the terminals of the TAB tape to the lead frame (Japanese Patent Laid-Open Publication No. HEI 4-184949). According to this method, TAB tapes corresponding to the dimensions and electrode arrangement of each semiconductor chip are required. Therefore this method lacks general use properties. Furthermore, there is a possibility that the tape deflects due to inflow of resin in the resin encapsulating process, which causes displacement of the first and second semiconductor chips. When any of the first and second semiconductor chips is displaced, the encapsulating resin becomes smaller in thickness on the side where the displacement has occurred, and this also degrades the reliability.

SUMMARY OF THE INVENTION

The object of the present invention is therefore to provide a semiconductor integrated circuit and method of manufacturing the same capable of preventing the possible damage of the front surfaces of semiconductor chips, assembling the semiconductor integrated circuit without cost increase, and preventing the semiconductor chips from being displaced by the inflow of encapsulating resin when two or more semiconductor chips are assembled into one integrated body.

In order to accomplish the above object, a semiconductor integrated circuit according to an aspect of the present invention comprises:

a lead frame having a chip mounting section and a plurality of leads, the leads consisting of inner leads closer to the chip mounting section and outer leads away from the chip mounting section;

an elastic insulating film bonded onto the chip mounting section;

a first semiconductor chip having a front surface provided with a plurality of electrodes in a peripheral portion thereof, and mounted on the chip mounting section with interposition of the elastic insulating film therebetween, wherein a central portion of the front surface of the first semiconductor chip is bonded to the elastic insulating film and the peripheral portion of the first semiconductor chip is outside of the chip mounting section;

a second semiconductor chip having a front surface provided with a plurality of electrodes in a peripheral portion thereof, and mounted on the first semiconductor chip, wherein a back surface of the second semiconductor chip is fixed to a back surface of the first semiconductor chip by means of an adhesive; and metal wires connecting the electrodes of the first and second semiconductor chips with the inner leads of the lead frame.

This semiconductor integrated circuit can be fabricated by a method which comprises the steps of:

preparing (1) a lead frame having a chip mounting section and a plurality of leads, the leads consisting of inner leads closer to the chip mounting section and outer leads away from the chip mounting section, (2) a first semiconductor chip having a front surface provided with a plurality of electrodes in a peripheral portion thereof, the front surface having an area larger than that of the chip mounting section such that the peripheral portion of the front surface of the first semiconductor chip extends from the chip mounting section when the first semiconductor chip is mounted on the chip mounting section, (3) a second semiconductor chip having a front surface provided with a plurality of electrodes in a peripheral portion thereof, and (4) and an insulating film having elasticity;

bonding a central portion of the front surface of the first semiconductor chip to the chip mounting section with interposition of the insulating film therebetween, with the electrodes being placed outside of the chip mounting section;

connecting the electrodes of the first semiconductor chip to the inner leads by metal wires with a back surface of the first semiconductor chip supported on a jig surface;

bonding a back surface of the second semiconductor chip to the back surface of the first semiconductor chip via an adhesive with a surface of the chip mounting section opposite from the first semiconductor chip supported on a jig surface; and connecting the electrodes of the second semiconductor chip to the inner leads by metal wires with the surface of the chip mounting section opposite from the first semiconductor chip supported on a jig surface.

According to this method, the step of bonding the first semiconductor chip to one surface of the chip mounting section of the lead frame (i.e., the die bonding process of the first semiconductor chip) is performed by interposing the insulating film having elasticity between the chip mounting section and the first semiconductor chip. Therefore, the front surface of the first semiconductor chip suffers no damage in this process. Furthermore, the step of connecting the electrodes on the front surface of the first semiconductor chip to the inner leads of the lead frame by the metal wires (i.e., the wire bonding process of the first semiconductor chip) is performed with the back surface of the first semiconductor chip put in contact with the surface of a jig. Therefore, the front surface of the first semiconductor chip suffers no damage in this process. Furthermore, the step of bonding the back surface of the second semiconductor chip to the back surface of the first semiconductor chip (i.e., the die bonding process of the second semiconductor chip) is performed with the surface of the chip mounting section opposite from the first semiconductor chip put in contact with the surface of a jig. Therefore, the front surface of the first semiconductor chip suffers no damage in this process. Furthermore, even though the front surface of the second semiconductor chip is pressed by a die bonding collet in this process, the insulating film interposed between the chip mounting section and the first semiconductor chip absorbs the load by its elasticity. Therefore, the front surface of the second semiconductor chip suffers no damage. Furthermore, the step of connecting the electrodes provided on the front surface of the second semiconductor chip to the inner leads of the lead frame by the metal wires (i.e., the wire bonding process of the second semiconductor chip) is performed with the surface of the chip mounting section opposite from the first semiconductor chip put in contact with the surface of a jig. Therefore, the front surface of the first semiconductor chip suffers no damage in this process. Subsequently, the resin sealing process and the outer lead bending process normally follow. The front surfaces of the first and second semiconductor chips suffer no damage in these processes. As a result, according to the present manufacturing method, the front surfaces of the semiconductor chips suffer no damage. Furthermore, this manufacturing method requires only a single resin sealing process. Therefore no cost increase results. Furthermore, in the resin sealing process, because the semiconductor chips are bonded to the chip mounting section of the lead frame, the first and second semiconductor chips are prevented from being displaced by the inflow of the sealing resin, unlike the case where the assembly of the semiconductor chips is performed by means of a TAB tape.

Preferably, the chip mounting section of the lead frame is located at a level different from that of the inner leads of the lead frame in order that in the resulting integrated circuit, a sealing resin is given an approximately equal thickness on the lower side of the chip mounting section and on the upper side of the second semiconductor chip.

According to another aspect of the present invention, at least one of the first and second semiconductor chips includes a plurality of stacked semiconductor chips which are bonded to one another via an elastic insulating film in a manner that front surfaces of the stacked semiconductor chips having electrodes in a peripheral portion thereof are oriented in an identical direction and that the electrodes of one semiconductor chip are not hidden by another semiconductor chip.

This arrangement facilitates obtainment of higher integration density and enhanced functions of the resulting circuit. Furthermore, because the electrodes of one semiconductor chip are not hidden by another semiconductor chip in spite of the stacked structure of the semiconductor chips, in other words, the electrodes of the stacked semiconductor chips are all exposed, the wire bonding process of the semiconductor chips has no difficulty.

In an example, the stacked semiconductor chips have different sizes such that the peripheral portion having the electrodes of one semiconductor chip is outside of another semiconductor chip.

In another example, the stacked semiconductor chips consist of two rectangular semiconductor chips of an identical size, wherein the two semiconductor chips each have the electrodes along two adjacent edges thereof, and wherein one of the two semiconductor chips is displaced from the other semiconductor chip in an approximately diagonal direction such that the electrodes of the one semiconductor chip are not hidden by the other semiconductor chip.

In a further example, the stacked semiconductor chips consist of two elongated rectangular semiconductor chips of an identical size, wherein the two semiconductor chips each have the electrodes along two opposite shorter edges thereof, and wherein the other, longer edges of one of the two semiconductor chips intersect with those of the other semiconductor chip at substantially right angles such that the electrodes of the one semiconductor chip are not hidden by the other semiconductor chip.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 11A and 11B are different sectional views of a semiconductor integrated circuit produced with the first semiconductor chip shown in FIG. 7 and a second semiconductor chip having same construction;

FIG. 12 is a sectional view of a conventional semiconductor integrated circuit;

DETAILED DESCRIPTION OF THE PREFERRED EMBODIMENTS

The semiconductor integrated circuit and method of manufacturing the same of the present invention will be described in detail below based on embodiments thereof.

Figure 2:
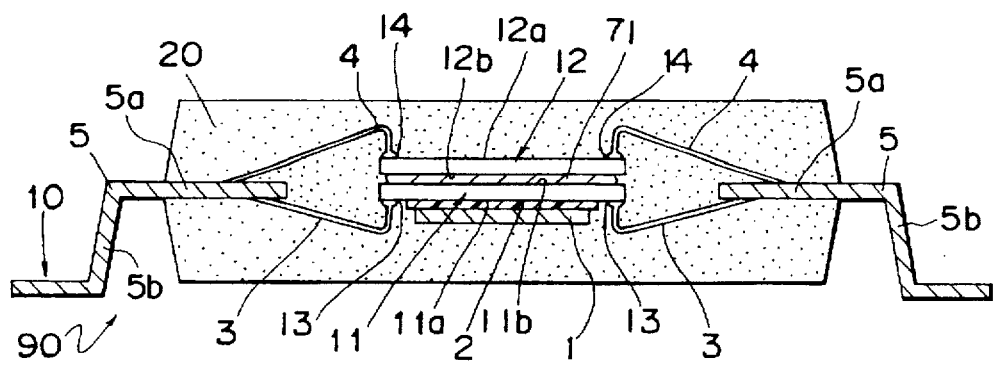
FIG. 2 is a sectional view of a semiconductor integrated circuit manufactured through the manufacturing procedure shown in FIGS. 1A–1I.

FIG. 2 shows a cross-sectional structure of a semiconductor integrated circuit 90 manufactured according to a manufacturing method of an embodiment of the present invention. The semiconductor integrated circuit 90 includes polyimide tapes 2 which each serve as an elastic insulating film, a first semiconductor chip 11, silver paste 71 which serves as an adhesive, and a second semiconductor chip 12, these components being stacked in this order on a surface (upper surface) of a die pad 1 of a lead frame 10. The lead frame 10 has the die pad 1 as a chip mounting section, and a plurality of leads 5 consisting of inner leads 5a and outer leads 5b. The reference numeral 20 denotes an encapsulating (i.e., sealing) resin.

In the present example, each of the semiconductor chips 11 and 12 has a thickness of 200 μm. In a peripheral portion of each of front surfaces 11a and 12a of the semiconductor chips 11 and 12 are provided a plurality of electrodes 13 and 14 which extend along the edges of the chips (see FIGS. 3, 5 and 7).

The lead frame 10 is formed of a metal sheet material such as 42-alloy or copper alloy having a thickness of 125 μm, and the leads 5 are connected with the rectangular die pad 1 in positions which are not included in the plane shown in FIG. 2. The die pad 1 is positioned at a level lower than the inner leads 5a of the leads 5 as shown in FIG. 2. The above arrangement is adopted for the purpose of giving an encapsulating resin 20 an approximately equal thickness on the lower side of the die pad 1 and on the upper side of the second semiconductor chip 12 when the device is completed. The surface size of the die pad 1 of the lead frame 10 is so designed that it corresponds to the area of a central portion on the inner side of the electrodes 13 of the front surface 11a of the first semiconductor chip 11. In other words, the peripheral portion having the electrodes 13 of the front surface 11a extends from the die pad 1.

The electrodes 13 and 14 provided on the front surfaces 11a and 12a of the semiconductor chips 11 and 12 are connected to the inner leads 5 of the lead frame 10 by gold wires 3 and 4.

The semiconductor integrated circuit 90 is manufactured by the following method.

Figure 1A:
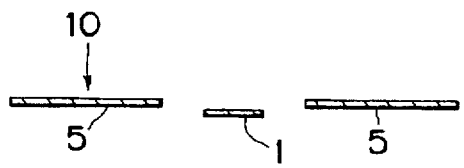
FIGS. 1A, 1B, 1C, 1D, 1E, 1F, 1G, 1H and 1I are illustrations showing a flow of processes for manufacturing a semiconductor integrated circuit according to an embodiment of the present invention.
Figure 1B:
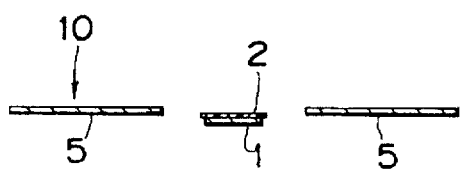

(1) First, a lead frame 10 is prepared as shown in FIG. 1A. As shown, the die pad 1 of the lead frame 10 has been already offset in level from the leads 5 by bending support leads (not shown) connected with the die pad 1 and an outer frame (not shown) for supporting the die pad 1 in position. As shown in FIG. 1B, the lead frame 10 is placed on a jig (not shown), and a rectangular polyimide tape 2 is supplied onto the upper surface of the die pad 1. The polyimide tape 2 has a substantially same surface size as the surface size of the die pad 1 and has a thickness of 20 µm. In the present example, the polyimide tape 2 has its upper and lower surfaces laminated with an 8-µm thick adhesive layer. The total modulus of elasticity of the polyimide tape 2 is $6.8 \times 10^9$ Pa and the modulus of elasticity of only the adhesive is $3.0 \times 10^9$ Pa. The polyimide tape 2 can be implemented by a commercially available polyimide tape used as a LOC-use tape or the like. It is also acceptable to use a single-layer type tape in which polyimide itself has a thermal plasticity and satisfactorily plays its role as an adhesive.

Figure 1C:
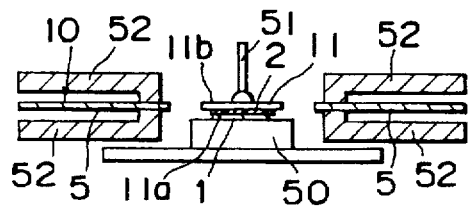

(2) Subsequently, as shown in FIG. 1C, the first semiconductor chip 11 is mounted on the upper surface of the polyimide tape 2. In this stage, the polyimide tape 2 confronts a central region of the front surface 11a of the first semiconductor chip 11 which exists on the inner side of the electrodes. Then, with the leads 5 clamped by a jig 52 and with the die pad 1 supported by a heater plate jig 50 heated to a temperature of 300° C., the front surface 11a of the semiconductor chip 11 is pressed by a collet 51. By this operation, the die pad 1, the polyimide tape 2 and the first semiconductor chip 11 are bonded together into an integrated body. In this way, die bonding of the first semiconductor chip 11 is completed. Because this process is performed by interposing the polyimide tape 2 having elasticity between the die pad 1 and the first semiconductor chip 11, the front surface 11a of the first semiconductor chip 11 is prevented from suffering damage in this process.

Figure 1D:
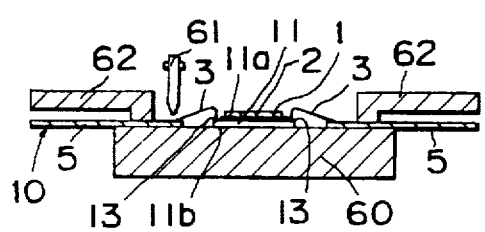

(3) Then, as shown in FIG. 1D, the lead frame 10 is inverted. Then, with a back surface 11b of the first semiconductor chip 11 supported by a jig 60 for preventing vibration and with the leads 5 clamped by a jig 62 and the jig 60, the electrodes 13 provided on the front surface 11a of the first semiconductor chip 11 are connected with the inner leads 5a by the gold wire 3 using a bonding tool 61. In this way, wire bonding of the first semiconductor chip 11 is completed. This process is performed with the back surface 11b of the first semiconductor chip 11 put in contact with the surface of the jig 60. Therefore the front surface 11a of the first semiconductor chip 11 suffers no damage in this process.

Figure 1E:
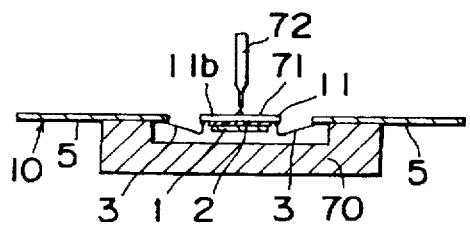
Figure 1F:
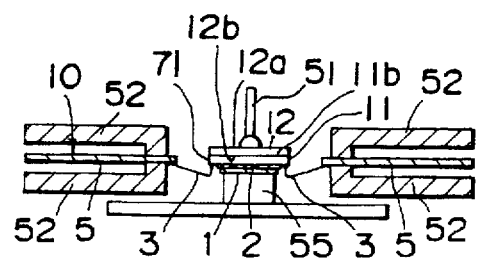

(4) Then, as shown in FIG. 1E, the lead frame 10 is again inverted, and a silver paste 71 is applied onto the back surface 11b of the first semiconductor chip 11 by means of a dispenser 72 with the leads 5 supported by a jig 70. Subsequently, as shown in FIG. 1F, with the leads 5 clamped by the jig 52, the second semiconductor chip 12 is mounted on the silver paste 71. Then, a front surface 12a of the second semiconductor chip 12 is pressed by the collet 51 with the lower surface of the die pad 1 supported by a jig 55. Then, the silver paste 71 (having a thickness of 5 to 10 µm) is heated to a temperature of about 80° C. to be hardened. By this operation, a back surface 12b of the second semiconductor chip 12 is bonded to the back surface 11b of the first semiconductor chip 11 via the silver paste 71. In this way, the die bonding of the second semiconductor chip 12 is completed. This process is performed with the lower surface of the die pad 1 put in contact with the jig 55. Therefore the front surface 11a of the first semiconductor chip 11 suffers no damage in this process. Furthermore, in this process, the front surface 12a of the second semiconductor chip 12 is pressed by the collet 51. However, the polyimide tape 2 interposed between the die pad 1 and the first semiconductor chip 11 absorbs the load by its elasticity. Therefore the front surface 12a of the second semiconductor chip 12 suffers no damage.

It is acceptable to use a varnish such as polyimide as an adhesive instead of the silver paste 71.

Figure 1G:
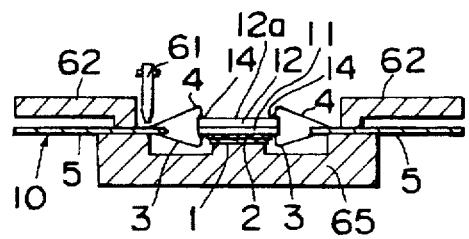

(5) Then, as shown in FIG. 1G, with the lower surface of the die pad 1 supported by a jig 65 and with the lead 5 clamped by a jig 62 and the jig 65, the electrodes 14 provided on the front surface of the second semiconductor chip 12 are connected with the inner leads 5a by a gold wire 4 by means of the bonding tool 61. In this way, wire bonding of the second semiconductor chip 12 is completed. This process is performed with the lower surface of the die pad 1 put in contact with the surface of the jig 65. Therefore the front surface 11a of the first semiconductor chip 11 suffers no damage in this process.

Figure 1H:
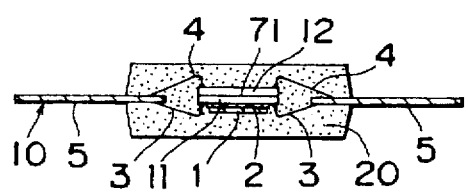
Figure 1I:
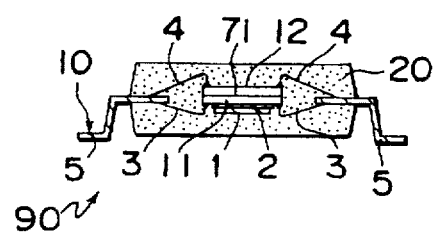
Figure 13A:
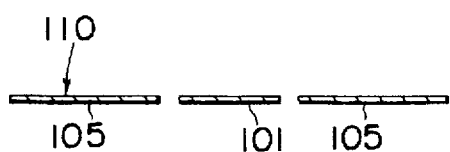
FIGS. 13A, 13B, 13C, 13D, 13E, 13F, 13G, 13H and 13I are flow charts showing a method for manufacturing the semiconductor integrated circuit of FIG. 12.
Figure 13B:
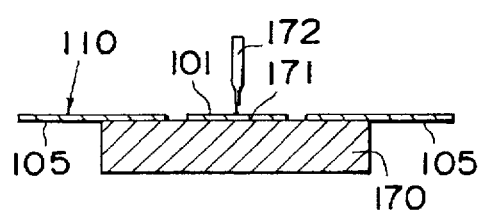
Figure 13C:
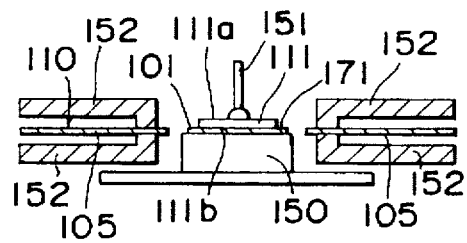
Figure 13D:
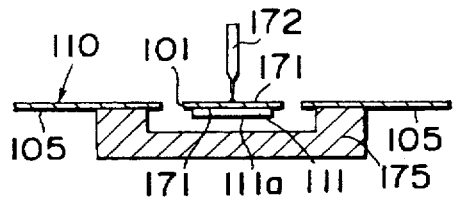
Figure 13E:
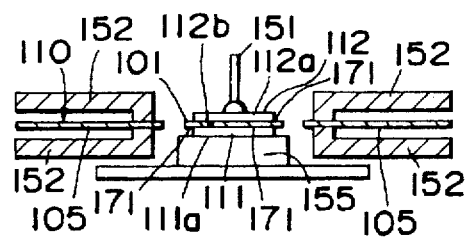
Figure 13F:
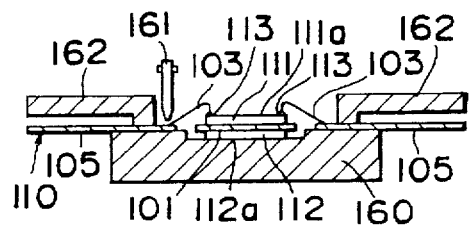
Figure 13G:
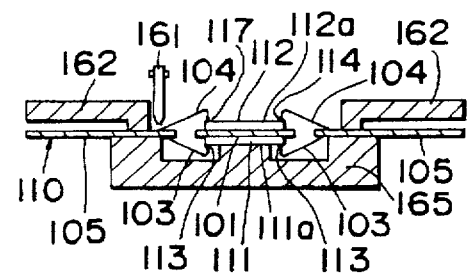
Figure 13H:
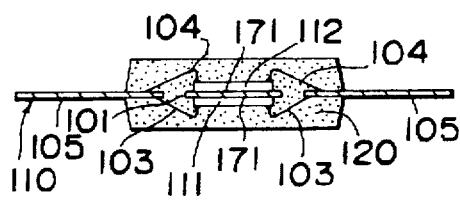
Figure 13I:
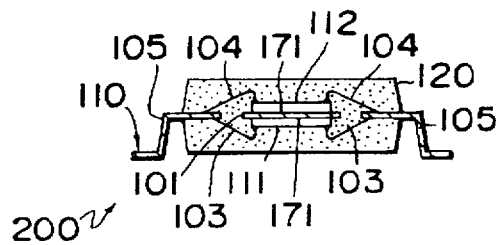
Figure 14A:
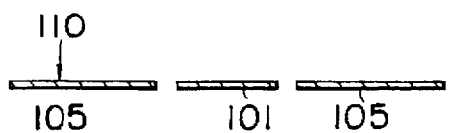
FIGS. 14A, 14B, 14C, 14D, 14E, 14F, 14G, 14H and 14I are flow charts showing another method for manufacturing the semiconductor integrated circuit of FIG. 12.
Figure 14B:
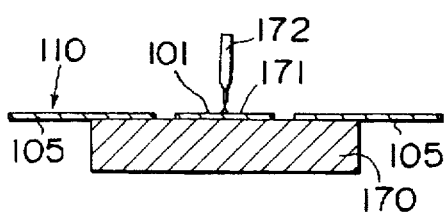
Figure 14C:
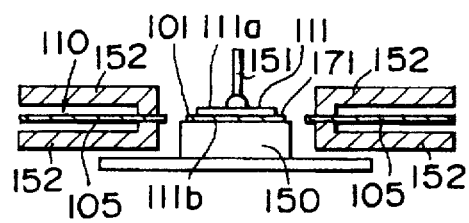
Figure 14D:
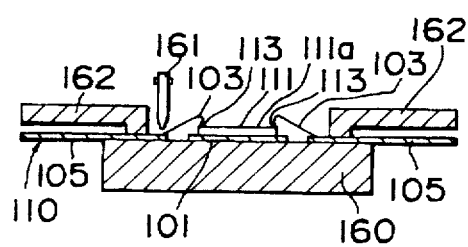
Figure 14E:
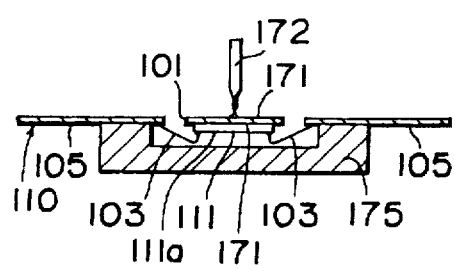
Figure 14F:
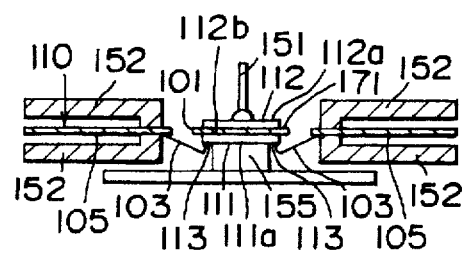
Figure 14G:
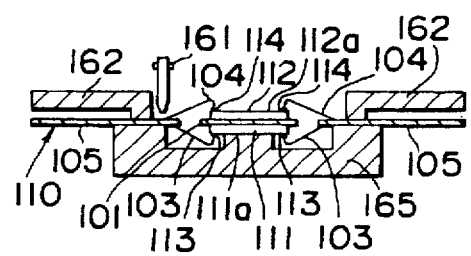
Figure 14H:
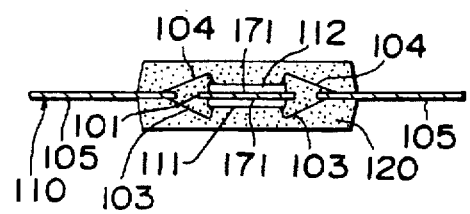
Figure 14I:
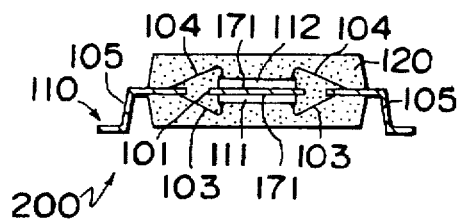

(6) Then, as shown in FIG. 1H, elements except for the outer leads 5b of the leads 5 are encapsulated or sealed by the resin 20 similarly to the prior art shown in FIG. 13H and FIG. 14H. Finally, as shown in FIG. 1I, dam bars (not shown) which bridge the adjacent leads 5 are punched out such that the adjacent outer leads 5b are disconnected from each other. Then, the outer leads 5b are bent in a specified shape. The device manufacturing is completed in this way. In these processes, the front surfaces 11a and 12a of the first and second semiconductor chips 11 and 12 suffer no damage.

As a result, according to the present manufacturing method, the front surfaces 11a and 12a of the first and second semiconductor chips 11 and 12 are prevented from suffering damage. Furthermore, this method requires only one resin encapsulating process. Therefore no cost increase results. Furthermore, in the resin encapsulating process, the semiconductor chips 11 and 12 are attached to (the die pad of) the lead frame 10. Therefore, unlike the prior art case where the assembly is performed by means of a TAB tape, the semiconductor chips 11 and 12 are not displaced by the inflow of the encapsulating resin.

Although the outer leads 5b are bent toward the lower surface side of the encapsulating resin 20 in the present example, the outer leads can be bent toward the upper surface side of the encapsulating resin 20. For instance, when a radiating fin is provided along the device, it is proper to determine the direction to bend the outer leads so that the die pad 1 is located on the side of the radiating fin. When such an arrangement is adopted, an improved radiating effect can be achieved for the heat generated from the semiconductor chips.

As at least one of the first and second semiconductor chips, there can be used a laminate of a plurality of semiconductor chips. The following will describe three examples of such a case.

Figure 3:
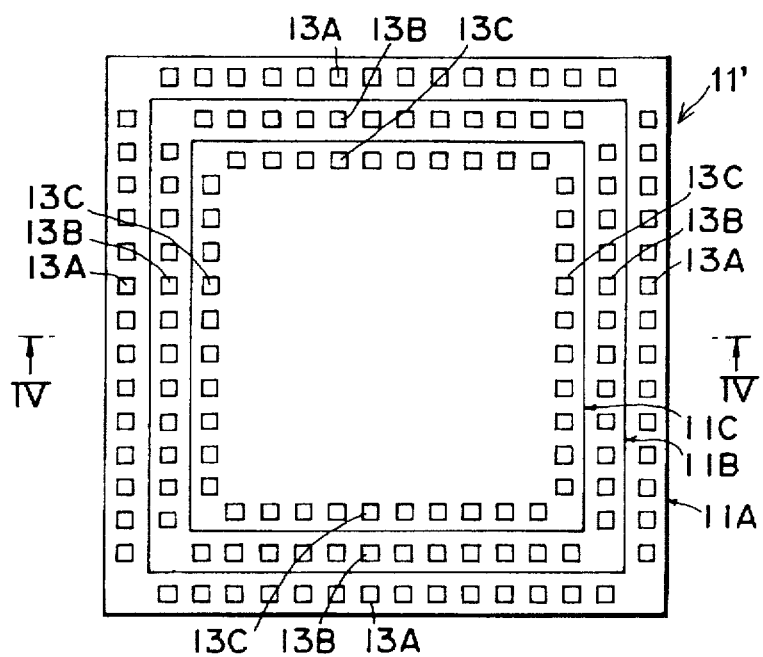
FIG. 3 is a plan view of an example of the first semiconductor chip made of a plurality of pre-laminated semiconductor chips.
Figure 4:
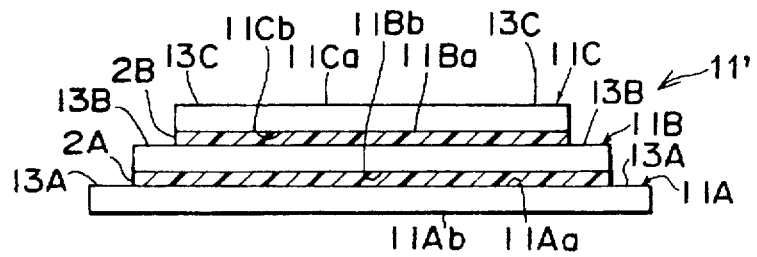
FIG. 4 is a sectional view taken along the line IV—IV in FIG. 3.

First, as shown in FIGS. 3 and 4, a first semiconductor chip 11' is formed by preparatorily stacking a plurality of semiconductor chips 11A, 11B and 11C having different surface sizes (FIG. 3 is a plan view of the first semiconductor chip 11', and FIG. 4 is a sectional view taken along the line IV—IV in FIG. 3). In the present example, a back surface 11Bb of the semiconductor chip 11B having a surface size smaller than that of the downwardly placed semiconductor chip 11A is bonded in a thermocompression manner to a central portion inside of electrodes 13A and 13A of a front surface 11Aa of the semiconductor chip 11A, with interposition of a polyimide tape 2A. Similarly, a back surface 11Cb of the semiconductor chip 11C having a surface size smaller than that of the semiconductor chip 11B is bonded in a thermocompression manner to a central portion inside of electrodes 13B and 13B of a surface 11Ba of the semiconductor chip 11B, with interposition of a polyimide tape 2B.

Figure 9:
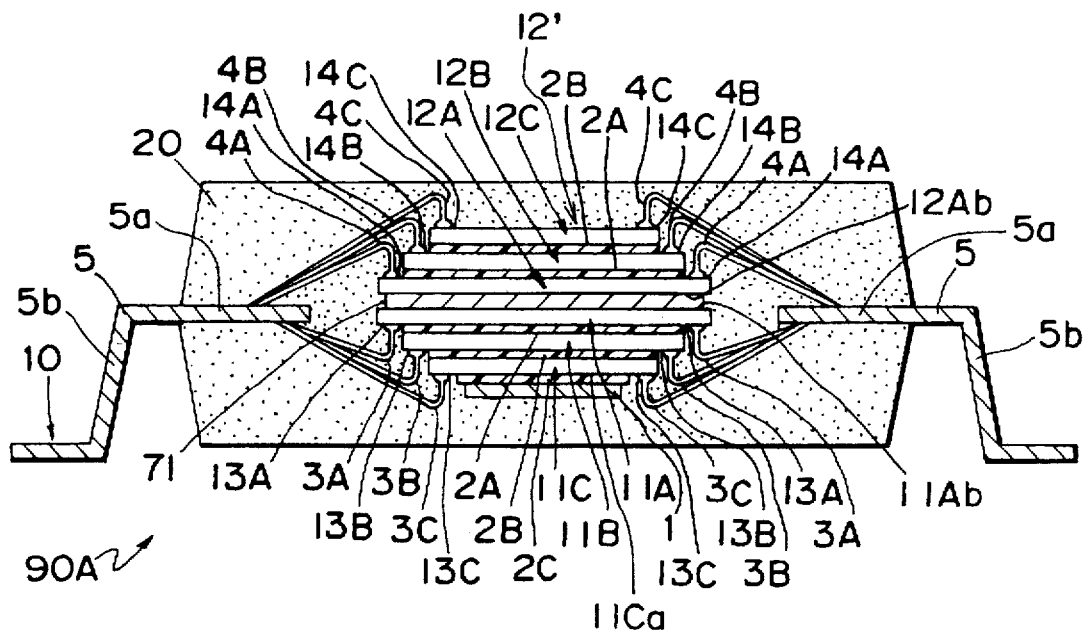
FIG. 9 is a sectional view of a semiconductor integrated circuit produced with the first semiconductor chip shown in FIGS. 3 and 4 and a second semiconductor chip having same construction.

FIG. 9 shows a semiconductor integrated circuit 90A wherein a second semiconductor chip 12' is also constituted of a plurality of semiconductor chips 12A, 12B and 12C formed in the same manner as in the first semiconductor chip 11'. This semiconductor integrated circuit 90A is assembled according to the aforementioned procedure of (1) through (6). In the semiconductor integrated circuit 90A, a front surface 11Ca of the smallest semiconductor chip 11C of the first semiconductor chip 11' is bonded to the upper surface of the die pad 1 of the lead frame 10 with interposition of the polyimide tape 2C, while a back surface 12Ab of the largest semiconductor chip 12A of the second semiconductor chip 12' is bonded to a back surface 11Ab of the largest semiconductor chip 11A of the first semiconductor chip 11' with interposition of the silver paste 71. In FIG. 9, reference numerals 14A, 14B and 14C denote electrodes provided on the front surfaces of the semiconductor chips 12A, 12B and 12C along their edges, and reference numerals 3A, 3B, 3C, 4A, 4B and 4C denote gold wires. With this arrangement, the semiconductor integrated circuit can be improved to have a higher integration density and higher functions in comparison with the case where each of the first and second semiconductor chips is constituted of a single semiconductor chip. Furthermore, in this embodiment, although the three semiconductor chips constituting the first or second semiconductor chips 11', 12' are stacked one on another, they have different sizes so that the electrodes 13A, 13B and 13C and the electrodes 14A, 14B and 14C provided along the edges are all exposed. In other words, the electrodes of one semiconductor chip are not hidden by another semiconductor chip. Therefore the wire bonding process of the semiconductor chips 11A, 11B and 11C and the semiconductor chips 12A, 12B and 12C is performed without difficulty. Of course, the number of semiconductor chips to be stacked is not limited to three, and the number of semiconductor chips to be stacked may be two, four, and so on.

Figure 5:
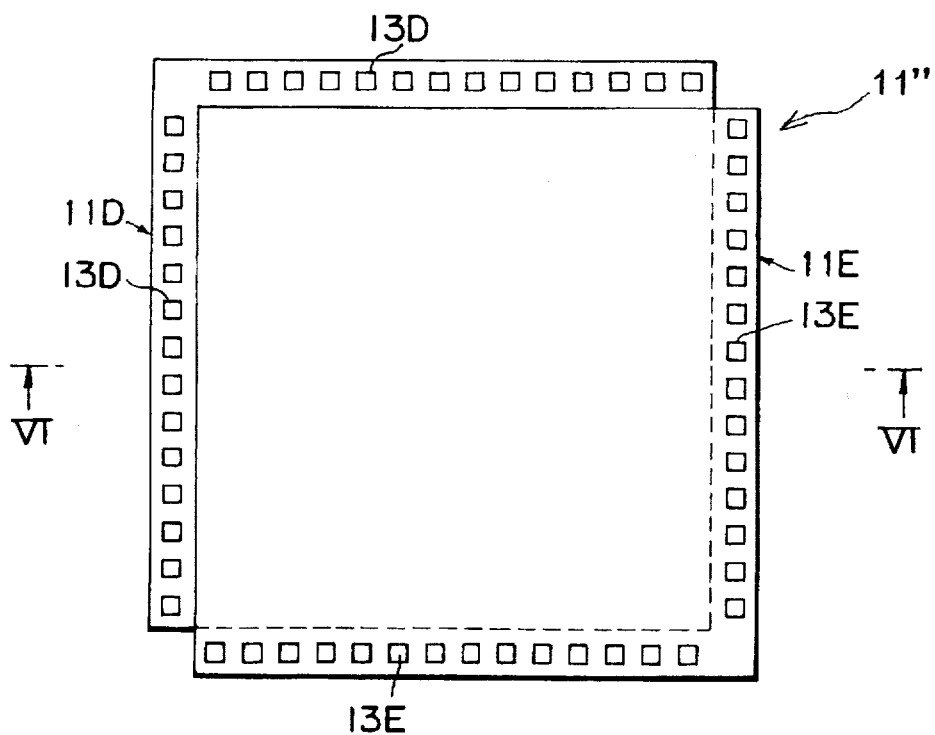
FIG. 5 is a plan view of another example of the first semiconductor chip made of a plurality of pre-laminated semiconductor chips.
Figure 6:
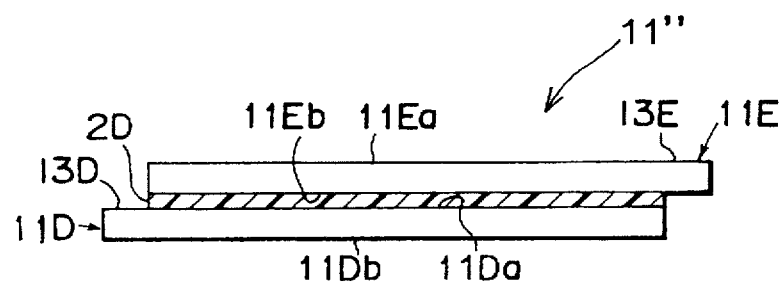
FIG. 6 is a sectional view taken along the line VI—VI in FIG. 5.

In a modified example, at least one of the first and second semiconductor chips is formed by preparatorily laminating two rectangular semiconductor chips having the same size. FIGS. 5 and 6 show such a first semiconductor chip 11" which is formed of two semiconductor chips 11D and 11E of the same size. In the present example, a back surface 11Eb of the upper semiconductor chip 11E is bonded in a thermocompression manner to a front surface 11Da of the lower semiconductor chip 11D with interposition of a polyimide tape 2D in a state in which the upper semiconductor chip 11E is displaced in an approximately diagonal direction so that the electrodes 13D and 13D arranged along adjacent two sides of the semiconductor chip 11D are exposed, that is, are not hidden by the other semiconductor chip. With this arrangement, the laminate of the first semiconductor chip can be constituted by the same semiconductor chips 12D and 12E.

Figure 10:
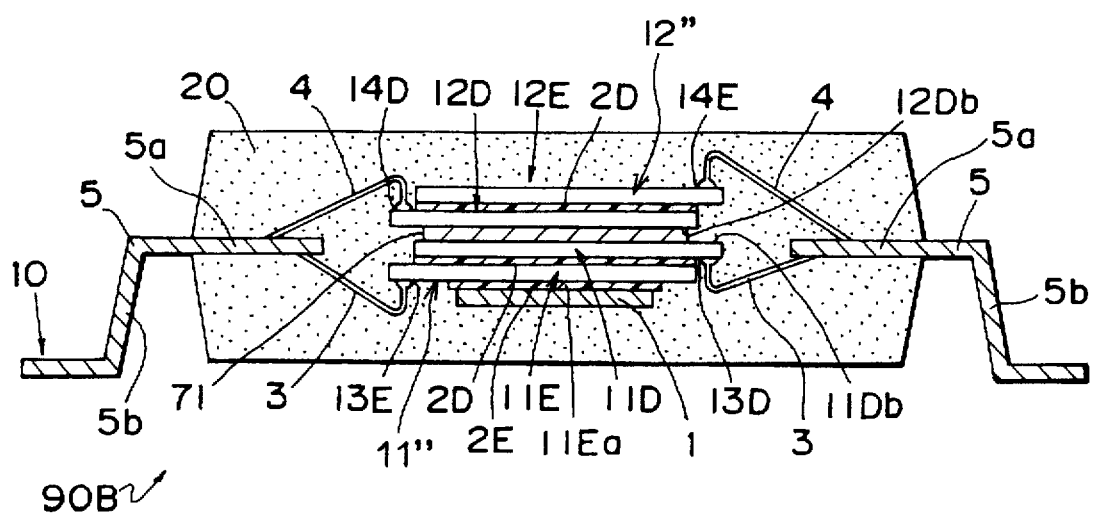
FIG. 10 is a sectional view of a semiconductor integrated circuit produced with the first semiconductor chip shown in FIGS. 5 and 6 and a second semiconductor chip having same construction.

FIG. 10 shows a semiconductor integrated circuit 90B wherein a second semiconductor chip 12" is also constituted of two semiconductor chips 12D and 12E formed in the same manner as in the first semiconductor chip 11". This semiconductor integrated circuit 90B is assembled according to the aforementioned procedure of (1) through (6). In the semiconductor integrated circuit 90B, a front surface 11Ea of the semiconductor chip 11E of the first semiconductor chip 11" is bonded to the upper surface of the die pad 1 of the lead frame 10 with interposition of a polyimide tape 2E, while a back surface 12Db of the semiconductor chip 12D of the second semiconductor chip 12" is bonded to a back surface 11Db of the semiconductor chip 11D of the first semiconductor chip 11" with interposition of the silver paste 71. In FIG. 10, reference numerals 14D and 14E denote electrodes provided on the front surfaces of the semiconductor chips 12D and 12E along the adjacent edges. With this arrangement, the semiconductor integrated circuit can be improved to have a higher integration density and higher functions in comparison with the case where each of the first and second semiconductor chips is constituted of a single semiconductor chip. Furthermore, in this embodiment, although the two semiconductor chips of the same size constituting the first or second semiconductor chips 11", 12" are laminated one on the other, they are displaced from each other so that the electrodes 13D and 13E and the electrodes 14D and 14E provided along the edges are all exposed. Therefore the wire bonding process of the semiconductor chips 11D and 11E and the semiconductor chips 12D and 12E is performed without difficulty.

Figure 7:
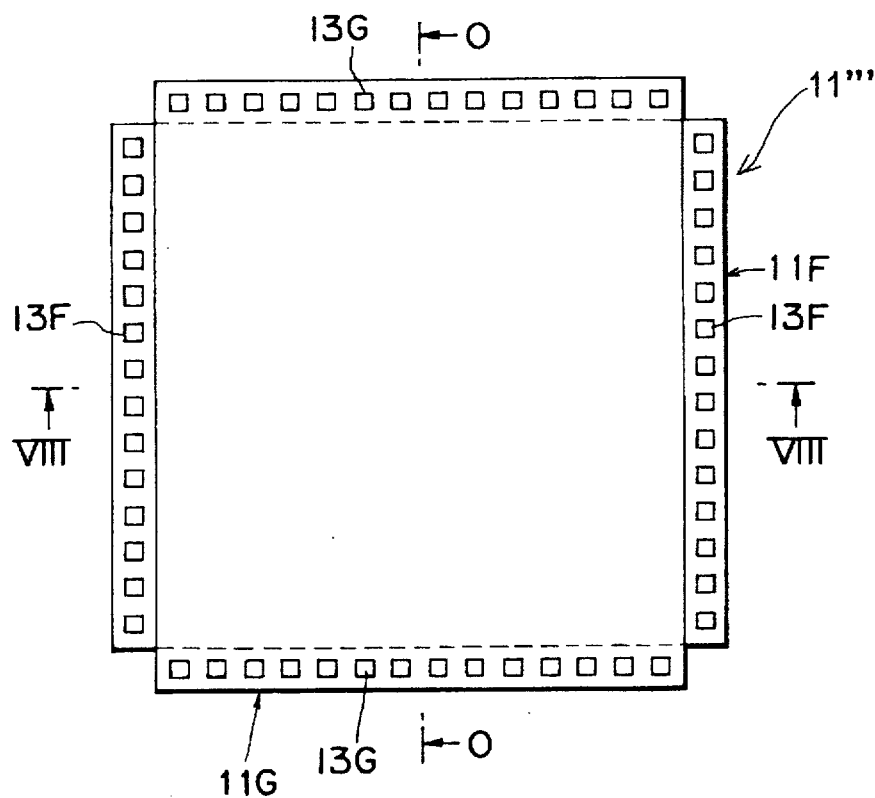
FIG. 7 is a plan view of yet another example of the first semiconductor chip made of a plurality of pre-laminated semiconductor chips.
Figure 8:
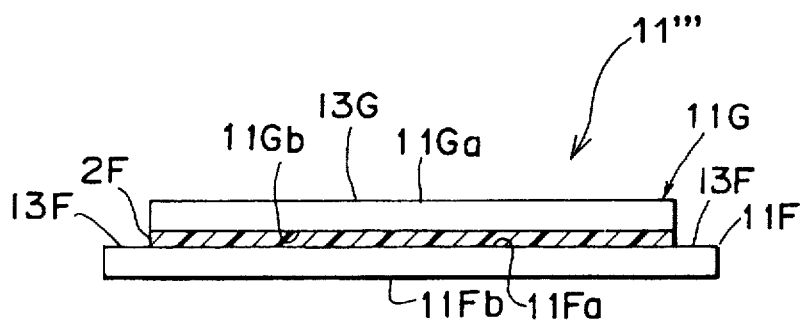
FIG. 8 is a sectional view taken along the line VIII—VIII in FIG. 7.

In another modified example, at least one of the first and second semiconductor chips is formed by preparatorily laminating two elongated rectangular semiconductor chips having the same size. FIGS. 7 and 8 show such a first semiconductor chip 11'" which is formed of two rectangular semiconductor chips 11F and 11G of the same size. In the present example, a back surface 11Gb of the upper semiconductor chip 11G is bonded in a thermocompression manner to a front surface 11Fa of the lower semiconductor chip 11F with interposition of a polyimide tape 2F in a state in which longer sides or edges of the upper and lower semiconductor chips 11G and 11F are intersected perpendicularly to each other so that the electrodes 13F arranged along opposite shorter sides of the lower semiconductor chip 11F are exposed, that is, are not hidden by the upper semiconductor chip 11G. With this arrangement, the laminate can be constituted by the same semiconductor chips 11F and 11G.

FIGS. 11A and 11B show a semiconductor integrated circuit 90C wherein a second semiconductor chip 12'" is also constituted of two semiconductor chips 12F and 12G formed in the same manner as in the first semiconductor chip 11'". This semiconductor integrated circuit 90C is assembled according to the aforementioned procedure of (1) through (6). In the semiconductor integrated circuit 90C, a front surface 11Ga of the lower semiconductor chip 11G of the first semiconductor chip 11'" is bonded to the upper surface of the die pad 1 of the lead frame 10 with interposition of a polyimide tape 2G, while a back surface 12Fb of the lower semiconductor chip 12F of the second semiconductor chip 12'" is bonded to a back surface 11Fb of the upper semiconductor chip 11F of the first semiconductor chip 11'" with interposition of the silver paste 71. In FIGS. 11A and 11B, reference numerals 14F and 14G denote electrodes provided on the front surfaces of the semiconductor chips 12F and 12G along the opposite shorter edges thereof. With this arrangement, the semiconductor integrated circuit can be improved to have a higher integration density and enhanced functions in comparison with the case where the first and second semiconductor chips each consist of a single semiconductor chip. Furthermore, in this example, although the two semiconductor chips constituting the first or second semiconductor chips 11'", 12'" are laminated one on the other, they have an elongated rectangular shape so that the electrodes 13F and 13G and the electrodes 14F and 14G provided along the opposite shorter edges are exposed. Therefore the wire bonding process of the semiconductor chips 11F and 11G and the semiconductor chips 12F and 12G is performed without difficulty.

The semiconductor integrated circuit manufacturing method of the present invention is applicable not only to a variety of regular-style molded type semiconductor integrated circuits such as SOP (Small Outline Package), TSOP (Thin Small Outline Package), UTSOP (Ultra Thin Small Outline Package), SOJ (Small Outline J-leaded Package), QFP (Quad Flat Package), QFJ (Quad Flat J-leaded Package) and DIP (Dual Inline Package) but also to irregular-style semiconductor integrated circuits produced by a potting resin sealing technique.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor integrated circuit, comprising:

a lead frame having a chip mounting section and a plurality of leads, the leads comprising inner leads closer to the chip mounting section and outer leads away from the chip mounting section;

an elastic insulating film bonded onto the chip mounting section;

a first semiconductor chip having a front surface provided with a plurality of electrodes in a peripheral portion thereof, and mounted on the chip mounting section with interposition of the elastic insulating film therebetween, wherein a central portion of the front surface of the first semiconductor chip is bonded to the elastic insulating film and the peripheral portion of the first semiconductor chip is outside of the chip mounting section;

a second semiconductor chip having a front surface provided with a plurality of electrodes in a peripheral portion thereof, and mounted on the first semiconductor chip, wherein a back surface of the second semiconductor chip is fixed to a back surface of the first semiconductor chip by means of an adhesive; and metal wires connecting the electrodes of the first and second semiconductor chips with the inner leads of the lead frame, wherein the electrodes of the first and second semiconductor chips are connected with the inner leads only by the metal wires and without a direct contact connection.

2. The semiconductor integrated circuit as claimed in claim 1, wherein the chip mounting section of the lead frame is located at a level different from that of the inner leads of the lead frame.

3. The semiconductor integrated circuit as claimed in claim 1, wherein at least one of the first and second semiconductor chips includes a plurality of stacked semiconductor chips which are bonded to one another via an elastic insulating film in a manner that front surfaces of the stacked semiconductor chips having electrodes in a peripheral portion thereof are oriented in an identical direction and that the electrodes of one semiconductor chip are not hidden by another semiconductor chip.

4. The semiconductor integrated circuit as claimed in claim 3, wherein the stacked semiconductor chips have different sizes such that the peripheral portion having the electrodes of one semiconductor chip is outside of another semiconductor chip.

5. The semiconductor integrated circuit as claimed in claim 3, wherein the stacked semiconductor chips comprising two rectangular semiconductor chips of an identical size, wherein the two semiconductor chips each have the electrodes along two adjacent edges thereof, and wherein one of the two semiconductor chips is displaced from the other semiconductor chip in an approximately diagonal direction such that the electrodes of the one semiconductor chip are not hidden by the other semiconductor chip.

6. The semiconductor integrated circuit as claimed in claim 1, wherein at least one of the first and second semiconductor chips includes a plurality of stacked semiconductor chips which are bonded to one another via an elastic insulating film and wherein the stacked semiconductor chips comprise two elongated rectangular semiconductor chips of an identical size, wherein the two semiconductor chips each have the electrodes along two opposite shorter edges thereof, and wherein the other, longer edges of one of the two semiconductor chips intersect with those of the other semiconductor chip at substantially right angles such that the electrodes of the one semiconductor chip are not hidden by the other semiconductor chip.

7. The semiconductor integrated circuit as claimed in claim 1, wherein the elastic insulating film is formed of polyimide.

8. A semiconductor integrated circuit, comprising:

a lead frame having a chip mounting section and leads;

an elastic insulating film bonded onto the chip mounting section;

a first semiconductor chip having a front surface and a back surface and including a plurality of electrodes disposed about a peripheral portion of the front surface, the electrodes being connected to respective ones of the leads, wherein the first semiconductor is mounted on the chip mounting section with interposition of the elastic insulating film therebetween;

a second semiconductor chip having a front surface and a back surface and including a plurality of electrodes disposed about a peripheral portion of the front surface, the electrodes being connected to respective others of the leads, wherein the back surface of the second semiconductor chip is fixed to the back surface of the first semiconductor chip by means of an adhesive; and metal wires connecting the electrodes of the first and second semiconductor chips to the respective ones of the leads and the respective others of the leads, wherein the electrodes of the first and second semiconductor chips are connected with the inner leads only by the metal wires and without a direct contact connection.

9. The semiconductor integrated circuit as claimed in claim 8, further comprising a resin coating encapsulating the first and second semiconductor chips.

10. The semiconductor integrated circuit as claimed in claim 9, wherein the leads are disposed extending from the chip mounting section within the resin coating to outside of the resin coating.

11. The semiconductor integrated circuit as claimed in claim 10, wherein the metal wires are disposed within the resin coating.

12. The semiconductor integrated circuit as claimed in claim 8 wherein at least one of the first and second semiconductor chips includes a plurality of stacked semiconductor chips which are bonded to one another via an elastic insulating film in a manner that front surfaces of the stacked semiconductor chips having electrodes in a peripheral portion thereof are oriented in an identical direction and that the electrodes of one semiconductor chip are not hidden by another semiconductor chip.

13. The semiconductor integrated circuit as claimed in claim 12, wherein the stacked semiconductor chips have different sizes such that the peripheral portion having the electrodes of one semiconductor chip is outside of another semiconductor chip.

14. The semiconductor integrated circuit as claimed in claim 12, wherein the stacked semiconductor chips comprise two rectangular semiconductor chips of an identical size, wherein the two semiconductor chips each have the electrodes along two adjacent edges thereof, and wherein one of the two semiconductor chips is displaced from the other semiconductor chip in an approximately diagonal direction such that the electrodes of the one semiconductor chip are not hidden by the other semiconductor chip.

15. The semiconductor integrated circuit as claimed in claim 8, wherein at least one of the first and second semiconductor chips includes a plurality of stacked semiconductor chips which are bonded to one another via an elastic insulating film and wherein the stacked semiconductor chips comprise two elongated rectangular semiconductor chips of an identical size, wherein the two semiconductor chips each have the electrodes along two opposite shorter edges thereof, and wherein the other, longer edges of one of the two semiconductor chips intersect with those of the other semiconductor chip at substantially right angles such that the electrodes of the one semiconductor chip are not hidden by the other semiconductor chip.

16. The semiconductor integrated circuit as claimed in claim 8, wherein the elastic insulting film is formed of polyimide.

* * * * *